United States Patent
Camacho et al.

(10) Patent No.: US 8,936,971 B2
(45) Date of Patent: Jan. 20, 2015

(54) INTEGRATED CIRCUIT PACKAGING SYSTEM WITH DIE PADDLES AND METHOD OF MANUFACTURE THEREOF

(75) Inventors: Zigmund Ramirez Camacho, Singapore (SG); Emmanuel Espiritu, Singapore (SG); Henry Descalzo Bathan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 514 days.

(21) Appl. No.: 12/884,102

(22) Filed: Sep. 16, 2010

(65) Prior Publication Data

US 2012/0068363 A1    Mar. 22, 2012

(51) Int. Cl.
| | |
|---|---|
| H01L 21/60 | (2006.01) |
| H01L 21/56 | (2006.01) |
| H01L 21/58 | (2006.01) |
| H01L 23/31 | (2006.01) |
| H01L 21/48 | (2006.01) |
| H01L 23/495 | (2006.01) |
| H01L 23/00 | (2006.01) |

(52) U.S. Cl.
CPC ........ *H01L 23/3107* (2013.01); *H01L 21/4832* (2013.01); *H01L 23/49503* (2013.01); *H01L 23/49541* (2013.01); *H01L 2224/48091* (2013.01); *H01L 2224/48247* (2013.01); *H01L 2224/48257* (2013.01); *H01L 2224/73265* (2013.01); *H01L 24/48* (2013.01); *H01L 2224/32245* (2013.01); *H01L 2924/3025* (2013.01)
USPC ........... 438/123; 438/111; 438/112; 438/124; 257/E23.031; 257/E23.037; 257/E23.04; 257/E21.502

(58) Field of Classification Search
CPC ................. H01L 21/4832; H01L 2224/48247; H01L 2224/73265; H01L 23/49582; H01L 2224/97; H01L 23/49575
USPC .......... 257/676, E21.506, E23.031, 666, 692, 257/E23.037, E23.04, E21.502; 438/123, 438/124, 111, 112
See application file for complete search history.

(56) References Cited

U.S. PATENT DOCUMENTS

| | | | |
|---|---|---|---|
| 5,084,753 A | 1/1992 | Goida et al. | |
| 2005/0003586 A1* | 1/2005 | Shimanuki et al. | ............ 438/124 |
| 2007/0001278 A1* | 1/2007 | Jeon et al. | ...................... 257/676 |
| 2008/0258278 A1* | 10/2008 | Ramos et al. | .................. 257/676 |
| 2009/0085181 A1 | 4/2009 | Advincula et al. | |
| 2010/0140763 A1 | 6/2010 | Camacho et al. | |

* cited by examiner

*Primary Examiner* — Jasmine Clark
(74) *Attorney, Agent, or Firm* — Ishimaru & Associates LLP

(57) ABSTRACT

A method of manufacture of an integrated circuit packaging system includes: forming a package paddle group having a first package paddle electrically isolated from a second package paddle; attaching an integrated circuit device on the first package paddle and the second package paddle; forming a standoff terminal adjacent the package paddle group and electrically connected to the integrated circuit device; connecting a paddle connector to the integrated circuit device and the first package paddle and another paddle connector to the integrated circuit device and the second package paddle; and forming an encapsulation over the integrated circuit device, the first package paddle, the second package paddle, and the standoff terminal, the encapsulation exposing a portion of the first package paddle, the second package paddle, and the standoff terminal.

10 Claims, 4 Drawing Sheets

INTEGRATED CIRCUIT PACKAGING SYSTEM WITH DIE PADDLES AND METHOD OF MANUFACTURE THEREOF

TECHNICAL FIELD

The present invention relates generally to an integrated circuit packaging system, and more particularly to a system with die paddles.

BACKGROUND ART

Market growth for high density and high output/input integrated circuit packages has resulted in a trend for electronic products that are lightweight, smaller in size, multi-functional, and capable of ever increasing higher speeds. Products must be capable of competing in world markets and attracting many consumers or buyers.

Electronic products such as cell phone base products, global positioning systems (GPS), satellites, communication equipment, consumer products, and a vast line of other similar products are in ever increasing global demand. It is very important for products to continue to improve in features, performance, and reliability while reducing product costs, product size, and to be available quickly for purchase by the consumers or buyers.

Smaller packages need to be electrically connected with other parts and components. As the smaller packages with more circuits continue to get shrink in size, there is a greater need to produce the smaller packages with more and more package connectors to support continually increasing amounts of electrical connections to and from those smaller packages.

Thus, an increasing need remains to increase the electrical connections of packages as the sizes of the packages continue to shrink in size while the circuits inside those packages continue to increase. It is also critical that the electrical connections are created and placed with precision so that each of the electrical connections can be spaced apart from one another. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a package paddle group having a first package paddle electrically isolated from a second package paddle; attaching an integrated circuit device on the first package paddle and the second package paddle; forming a standoff terminal adjacent the package paddle group and electrically connected to the integrated circuit device; connecting a paddle connector to the integrated circuit device and the first package paddle and another paddle connector to the integrated circuit device and the second package paddle; and forming an encapsulation over the integrated circuit device, the first package paddle, the second package paddle, and the standoff terminal, the encapsulation exposing a portion of the first package paddle, the second package paddle, and the standoff terminal.

The present invention provides an integrated circuit packaging system, including: a package paddle group having a first package paddle electrically isolated from a second package paddle; an integrated circuit device on the first package paddle and the second package paddle; a standoff terminal adjacent the package paddle group and electrically connected to the integrated circuit device; a paddle connector connected to the integrated circuit device and the first package paddle and another paddle connector connected to the integrated circuit device and the second package paddle; and an encapsulation over the integrated circuit device, the first package paddle, the second package paddle, and the standoff terminal, a portion of the first package paddle, the second package paddle, and the standoff terminal exposed from the encapsulation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
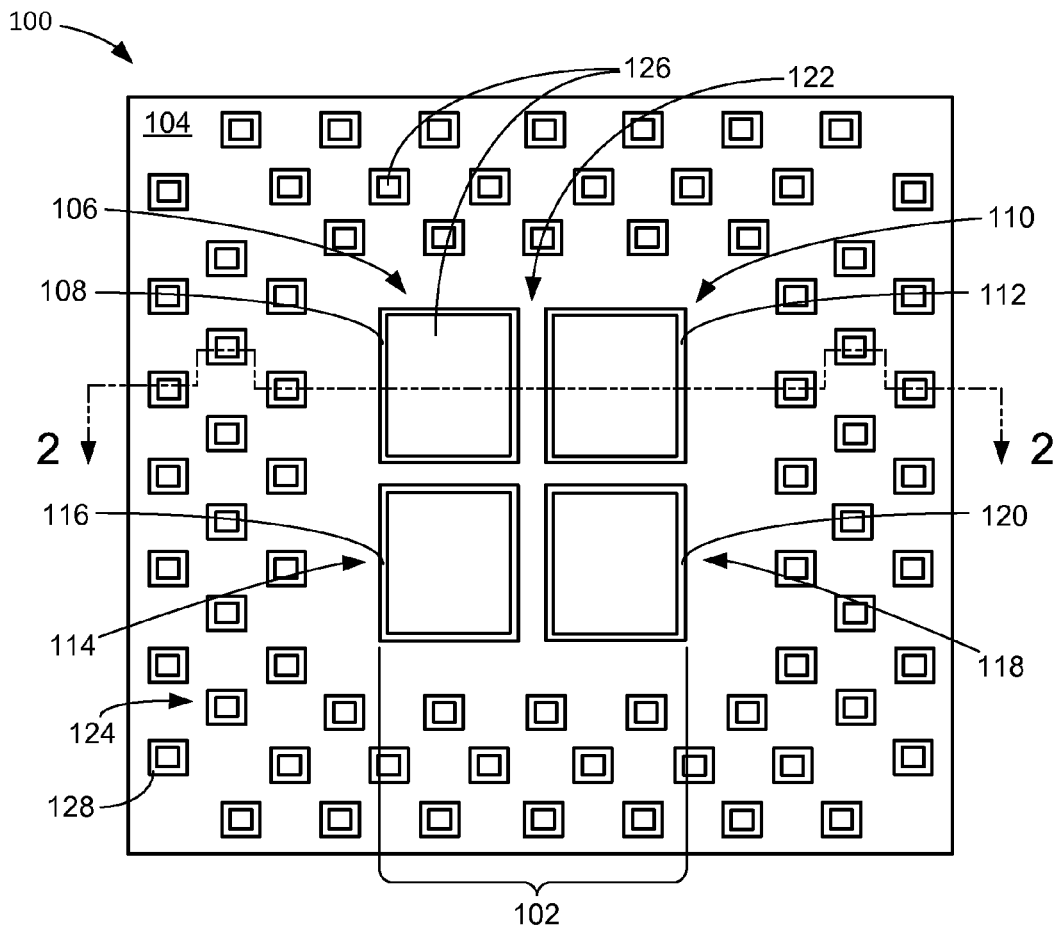
FIG. 1 is a bottom view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in an embodiment of the present invention. The integrated circuit packaging system 100 is shown with a package paddle group 102 having an outline shape of a rectangle.

A portion of the package paddle group 102 can be exposed from an encapsulation 104. The encapsulation 104 can be used to protect the integrated circuit packaging system 100 by providing structural support, and hermetically sealing the contents of the integrated circuit packaging system 100.

The package paddle group 102 can include a first package paddle 106 having a first lower paddle end 108, a second package paddle 110 having a second lower paddle end 112, a third package paddle 114 having a third lower paddle end 116, or a fourth package paddle 118 having a fourth lower paddle end 120. For purposes of illustration, the first package paddle 106, the second package paddle 110, the third package paddle 114, and the fourth package paddle 118 shown having identical shapes and sizes.

The first package paddle 106, the second package paddle 110, the third package paddle 114, or the fourth package paddle 118 can have different shapes or sizes. For example, the first package paddle 106, the second package paddle 110, the third package paddle 114, or the fourth package paddle 118 can have shape of a square, a rectangle, a triangle, or a hexagon, respectively.

The first package paddle 106 can have a shape of a rectangle and can be located at a corner of the outline shape of the package paddle group 102. The second package paddle 110 can be located a corner of the outline shape horizontally offset to the right of the first package paddle 106 and have sides coplanar and sides parallel with sides of the first package paddle 106.

The third package paddle 114 can be located at a corner of the outline shape vertically offset below the first package paddle 106 and have sides coplanar and sides parallel with the sides of the first package paddle 106. The fourth package paddle 118 can be located at a corner of the outline shape opposite the first package paddle 106 and have sides coplanar and sides parallel with the sides of the third package paddle 114.

For illustrative purposes, the package paddle group 102 has been shown and described as having four package paddles. It is understood that the package paddle group 102 can have two or more package paddles. For example, the package paddle group 102 can include five package paddles.

The first package paddle 106, the second package paddle 110, the third package paddle 114, or the fourth package paddle 118 can include a die pad, a die attached pad plane, or a split pad. The first package paddle 106, the second package paddle 110, the third package paddle 114, and the fourth package paddle 118 are isolated and separated from one another by a gap 122. The gap 122 is defined as areas formed by facing sides of any two package paddles within the package paddle group 102.

Standoff terminals 124 having a lower standoff end 128 can be formed around or adjacent the package paddle group 102 to provide connectivity to circuitry within the integrated circuit packaging system 100. The lower standoff end 128 can be exposed from the encapsulation 104. Each of a plurality of the standoff terminals 124 is smaller than the third package paddle 114.

A conductive layer 126 of electrically connective material resistant to etchants can be on an exposed surface of the lower standoff end 128 extending above the encapsulation 104. For example, the conductive layer 126 can be applied on exposed surfaces of the first lower paddle end 108, the second lower paddle end 112, the third lower paddle end 116, or the fourth lower paddle end 120 extending above the encapsulation 104. Also for example, the conductive layer 126 can be plated on exposed surfaces of the first lower paddle end 108, the second lower paddle end 112, the third lower paddle end 116, or the fourth lower paddle end 120 extending above the encapsulation 104.

The conductive layer 126 can be a gold plating, a tin plating, a pre plated finish, or a plating layer of a pre-plated leadframe. The conductive layer 126 can be used to directly mount and provide connectivity between the lower standoff end 128 or the package paddle group 102 of the integrated circuit packaging system 100 and a next level of integration (not shown) such as a substrate, an integrated circuit package, a subsystem, an electronic component, or any combination thereof.

It has been discovered that the package paddle group 102 having an outline shape of a square or a rectangular provides the integrated circuit packaging system 100 with optimum power or ground isolation, thermal contact area, and electromagnetic interference shielding capability.

Figure 2:
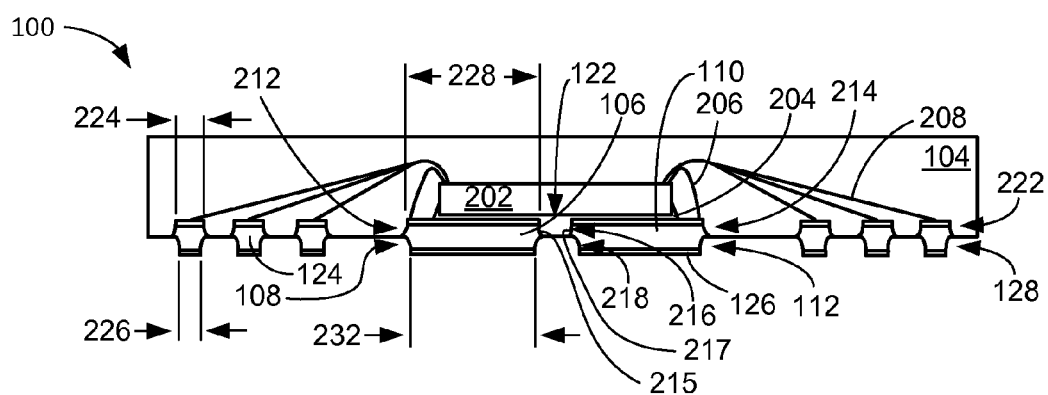
FIG. 2 is a cross-sectional view of FIG. 1 taken along a line 2-2.

Referring now to FIG. 2, therein is shown a cross-sectional view of FIG. 1 taken along a line 2-2. The integrated circuit packaging system 100 can include an integrated circuit device 202 or a flip chip, a non-conductive adhesive 204 or non-conductive epoxy, paddle connectors 206, and terminal connectors 208.

An active side of the integrated circuit device 202 is positioned above and facing away from the package paddle group 102 of FIG. 1. The active side is defined as a side of the integrated circuit device 202 having active circuitry fabricated thereon or having elements for connection to the active circuitry within the integrated circuit device 202. The integrated circuit device 202 is mounted on a first upper end 212 of the first package paddle 106, a second upper end 214 of the second package paddle 110, and upper ends of the third package paddle 114 of FIG. 1 or the fourth package paddle 118 of FIG. 1 using the non-conductive adhesive 204. The non-conductive adhesive 204 is directly on a first non-horizontal side 215 of the first upper end 212 and a second non-horizontal side 217 of the second upper end 214. The first non-horizontal side 215 is facing the second non-horizontal side 217. The first non-horizontal side 215 is separated from the second non-horizontal side 217 by the gap 122.

Figure 3:
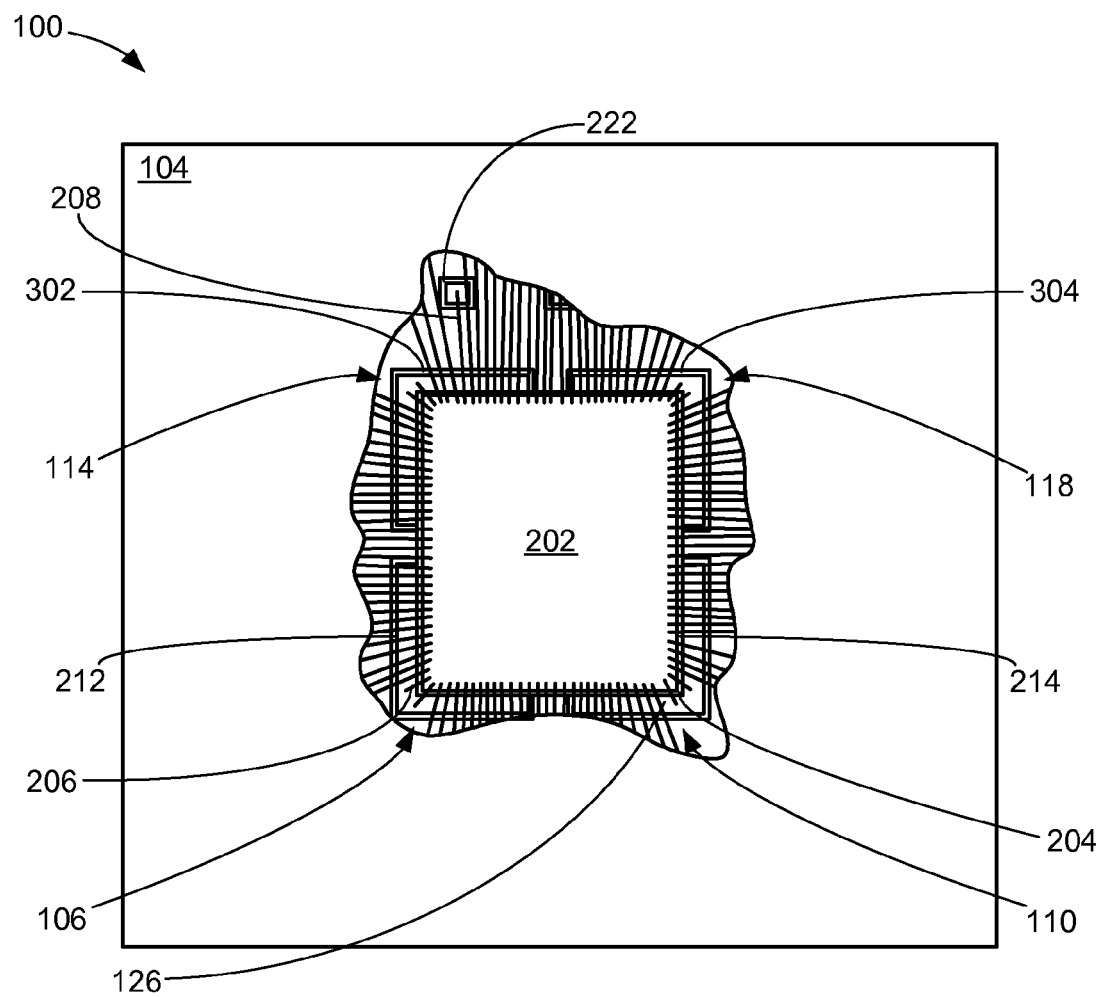
FIG. 3 is a top plan view of FIG. 2.

The non-conductive adhesive 204 can be attached to portions of the conductive layer 126 covering the first upper end 212, the second upper end 214, a third upper end 302 of FIG. 3 of the third package paddle 114, or a fourth upper end 304 of FIG. 3 of the fourth package paddle 118. The material of the conductive layer 126 covering the first upper end 212, the second upper end 214, the third upper end 302, the fourth upper end 304, the first lower paddle end 108, the second lower paddle end 112, the third lower paddle end 116, or the fourth lower paddle end 120 can be different from one another.

The non-conductive adhesive 204 can fill an upper gap portion 216 of the gap 122 and covering shaped or curved sides of the first upper end 212, the second upper end 214, the third upper end 302, or the fourth upper end 304 of the package paddles. A lower gap portion 218 of the gap 122 can include a channel between the package paddles. The channel is formed from the non-conductive adhesive 204 in the upper gap portion 216 and from pairs of shaped or curved sides of the first lower paddle end 108, the second lower paddle end 112, the third lower paddle end 116, or the fourth lower paddle end 120 of the package paddles adjacent one another.

The first package paddle 106, the second package paddle 110, the third package paddle 114, or the fourth package paddle 118 can each preferably be connected to a voltage source or a ground different from one another. For example, the first package paddle 106 can be connected to a digital ground, the second package paddle 110 can be connected to an analog ground, the third package paddle 114 can be connected to a digital voltage level, and the fourth package paddle 118 can be connected to an analog voltage level.

The paddle connectors 206 are shown connecting to the active side of the integrated circuit device 202 and the first package paddle 106 or the second package paddle 110. The paddle connectors 206 can include wire or bonding wires to provide electrical connectivity between powers or grounds of the integrated circuit device 202 and a package paddle of the package paddle group 102 connected to a power or ground needed by the integrated circuit device 202.

It has been discovered that the first package paddle 106, the second package paddle 110, the third package paddle 114, the fourth package paddle 118, or combination thereof improve reliability of the integrated circuit packaging system 100 by reducing power or ground interference.

For example, packaging applications having combined analog and digital circuitry and the package paddle group 102 have reduced coupled interference from digital high speed switching and current spikes using split pad configurations when compared to a similar packaging application using a common ground plane.

In a further example, a package having an ASIC controller, SRAM, and integrated memory devices can have a split pad to separate powers or grounds of the ASIC controller, SRAM and integrated memory devices from one another.

It has been discovered that the first package paddle 106, the second package paddle 110, the third package paddle 114, the fourth package paddle 118, or combination thereof improves electrical performance and signal integrity by providing separated and isolated ground or power planes.

It has also been discovered that the gap 122 improves the ground and power electrical coupling characteristics between the first package paddle 106, the second package paddle 110, the third package paddle 114, or the fourth package paddle 118 by controlling mutual fringe capacitive coupling.

It has been further discovered that profile shapes of the first upper end 212, the second upper end 214, the third upper end 302, or the fourth upper end 304, improve the ground and power electrical coupling characteristics by providing a range of mutual fringe capacitances optimized to a range of voltage transients.

It has been unexpected found that standoff quad flat no lead packages and multiple row standoff quad flat no lead packages with the package paddles provide the same benefits and capabilities of a ball grid array package with circuitry requiring separated and isolated Vss ground planes and Vdd power planes.

The terminal connectors 208 can be connected to the active side of the integrated circuit device 202 and an upper standoff end 222 of the standoff terminals 124. The terminal connectors 208 can include wire or bonding wires to provide connectivity between circuitry of the integrated circuit device 202 and the conductive layer 126 on the upper standoff end 222. The terminal connectors 208 can optionally be used to provide connectivity between power or ground of the integrated circuit device 202 and the upper standoff end 222.

The upper standoff end 222 of each of the standoff terminals 124, the first upper end 212, the second upper end 214, the third upper end 302, the fourth upper end 304, the paddle connectors 206, the terminal connectors 208, and the integrated circuit device 202 can be covered by the encapsulation 104. The first lower paddle end 108, the second lower paddle end 112, the third lower paddle end 116, the fourth lower paddle end 120, the lower standoff end 128 of the standoff terminals 124, and the lower gap portion 218 of the gap 122 are exposed and protruding from the encapsulation 104.

An inner standoff width 224 of the standoff terminals 124 is greater than an outer standoff width 226. The inner standoff width 224 is defined as a maximum cross-sectional width of the upper standoff end 222. The outer standoff width 226 is defined as a maximum cross-sectional width of the lower standoff end 128.

It has been unexpectedly determined that the inner standoff width 224 of the standoff terminals 124 and the outer standoff width 226 significantly improves structural integrity, mold interlock, and stability of the standoff terminals 124.

An inner paddle area 228 of a package paddle is greater than an outer paddle area 232 the package paddle. The inner paddle area 228 is defined as the surface area of the conductive layer 126 on an upper end of a package paddle. The outer paddle area 232 is defined as the surface area of the conductive layer 126 on a lower paddle end of the package paddle.

Referring now to FIG. 3, therein is shown a top plan view of FIG. 2. An upper portion of the encapsulation 104 is removed to show the integrated circuit device 202 mounted over portions of the conductive layer 126 covering the first upper end 212, the second upper end 214, the third upper end 302 of the third package paddle 114, and the fourth upper end 304 of the fourth package paddle 118.

Areas of the conductive layer 126 on the first upper end 212, the second upper end 214, the third upper end 302, or the fourth upper end 304 exposed from the integrated circuit device 202 and the non-conductive adhesive 204 can be connected to the integrated circuit device 202 using the paddle connectors 206. Two paddle connectors 206 are shown connected to the first upper end 212 of the first package paddle 106, which is larger than the standoff terminal 124 shown in FIG. 2.

Each of the paddle connectors 206 can provide a power or a ground connection between one of the package paddles and the integrated circuit device 202. One of the terminal connectors 208 is shown connecting the circuitry of the integrated circuit device 202 with the conductive layer 126 on the upper standoff end 222.

It has been discovered that the package paddle group 102 and the standoff terminals 124 provide the integrated circuit packaging system 100 with maximized input or output signal connectivity. The package paddle group 102 can be dedicated to provide power and ground connections between the integrated circuit packaging system 100 and the next level of integration thus enabling all of the standoff terminals 124 to be allocated for circuitry input or output signal connectivity.

Figure 4:
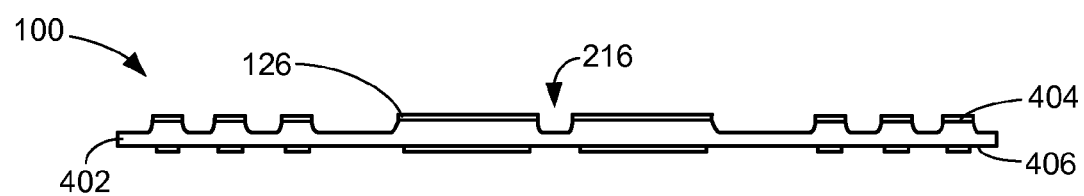
FIG. 4 is the cross-sectional view of FIG. 2 in a material removal phase of manufacture.

Referring now to FIG. 4, therein is shown the cross-sectional view of FIG. 2 in a material removal phase of manufacture. A conductive panel 402 or leadframe formed from an etchable material a copper, or a copper alloy, is shown having a top side 404 and a bottom side 406 opposite the top side 404. The conductive layer 126 is formed over the top side 404 and the bottom side 406. The conductive layer 126 is can be used to form the standoff terminals 124 of FIG. 2 and package paddles of FIG. 2.

An upper portion of the conductive panel 402 exposed from the conductive layer 126 over the top side 404 can removed during the partial removal phase. The partial removal phase can include a removal process that can include a chemical etching or a half-etching process.

The conductive layer 126 prevents and protects portions of the conductive panel 402 directly below the conductive layer 126 from removal. The partial removal phase also results in the formation of the upper gap portion 216 in the conductive panel 402.

Figure 5:
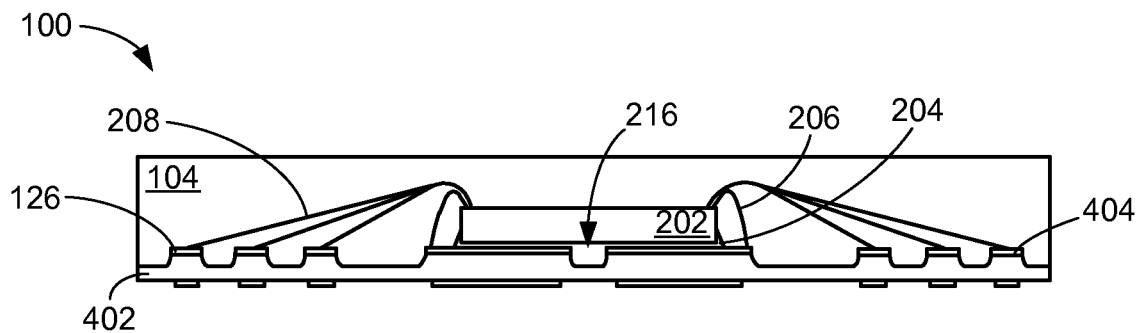
FIG. 5 is the cross-sectional view of FIG. 4 in an encapsulating phase.

Referring now to FIG. 5, therein is shown the cross-sectional view of FIG. 4 in an encapsulating phase. The active side of the integrated circuit device 202 is positioned over and facing away from the conductive layer 126 of the top side 404 used to form the package paddles of FIG. 2.

The integrated circuit device 202 is attached on the conductive layer 126 of the top side 404 used to form the package paddles of FIG. 2 using the non-conductive adhesive 204 during the chip mounting phase. The chip mounting phase can include a cleaning process, an applying process, a heating process, a cooling process, or a combination thereof. The non-conductive adhesive 204 also fills the upper gap portion 216 in the conductive panel 402 during the chip mounting phase.

Portions of the conductive layer 126 of the top side 404 used to form the package paddles of FIG. 2 are exposed from the integrated circuit device 202 and the non-conductive adhesive 204 are connected to the integrated circuit device 202 using the paddle connectors 206 during a circuit connecting phase.

The circuit connecting phase can include a connecting, a heating, a pressure, a bonding, a cleaning, or an attaching process. The conductive layer 126 used to form the standoff terminals 124 of FIG. 2 can be connected to the integrated circuit device 202 using the terminal connectors 208 during the circuit connecting phase.

The encapsulation 104 can be applied over the integrated circuit device 202, the terminal connectors 208, the paddle connectors 206, the conductive layer 126 on the top side 404, and remaining portions of the conductive panel 402 exposed during the encapsulating phase. The encapsulating phase can include a cleaning process, heating process, cooling process, and a mold apparatus (not shown).

Figure 6:
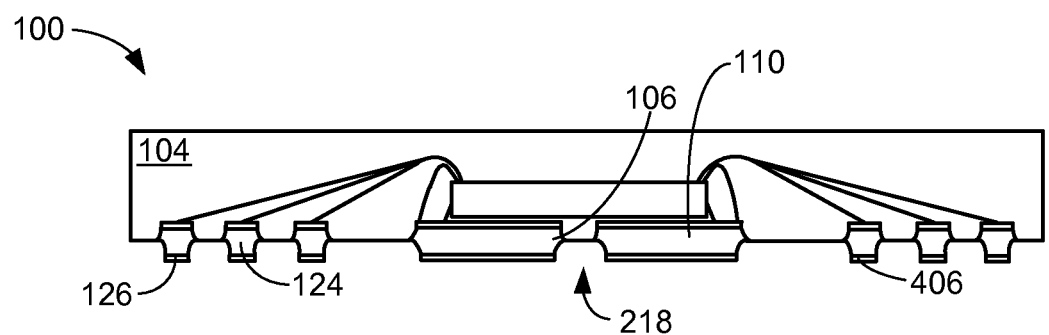
FIG. 6 is the cross-sectional view of FIG. 5 in a panel separation phase.

Referring now to FIG. 6, therein is shown the cross-sectional view of FIG. 5 in a panel separation phase. A lower portion of the conductive panel 402 of FIG. 5 exposed from the conductive layer 126 over the bottom side 406 can removed during the panel separation phase. The panel separation phase can include the removal process to form and electrically isolate/separate the standoff terminals 124 and the package paddle group 102 of FIG. 1 that includes the first package paddle 106, the second package paddle 110, the third package paddle 114 of FIG. 1, and the fourth package paddle 118 of FIG. 1.

The removal process results in removal of portions of the bottom side 406 to expose the encapsulation 104 to form the lower gap portion 218. The removal process also results in the encapsulation 104 physically separating the first package paddle 106, the second package paddle 110, the third lower paddle end 116 of FIG. 1, the fourth package paddle 118 of FIG. 1, and the standoff terminals 124 from one another.

It has been discovered that the package paddle group 102 results in improved packaging yields over typical leadframe types with a split pad. For example, the package paddle group 102 is highly configurable and does not have the handling problems associated with typical split pad leadframe type packages such as quad flat no lead package and quad flat package.

Figure 7:
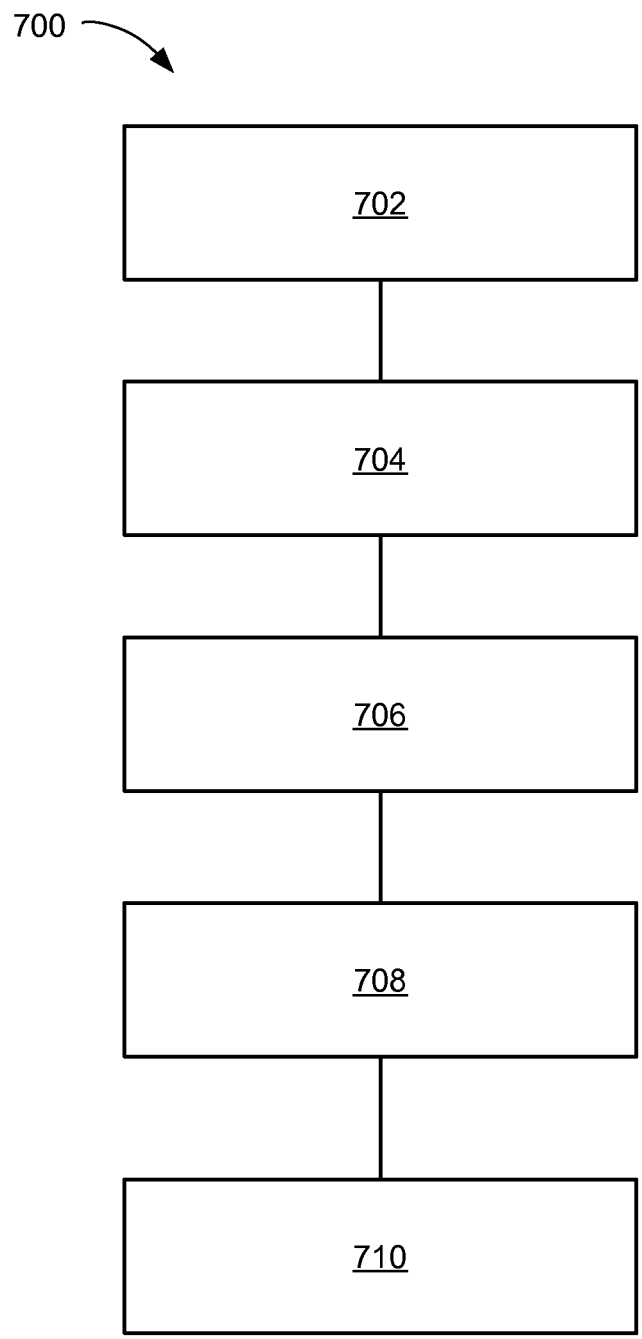
FIG. 7 is a flow chart of a method of manufacture of the integrated circuit packaging system in a further embodiment of the present invention.

Referring now to FIG. 7, therein is shown a flow chart of a method 700 of manufacture of the integrated circuit packaging system 100 in a further embodiment of the present invention. The method 700 includes: forming a package paddle group having a first package paddle electrically isolated from a second package paddle in a block 702; attaching an integrated circuit device on the first package paddle and the second package paddle in a block 704; forming a standoff terminal adjacent the package paddle group and electrically connected to the integrated circuit device in a block 706; connecting a paddle connector to the integrated circuit device and the first package paddle and another paddle connector to the integrated circuit device and the second package paddle in a block 708; and forming an encapsulation over the integrated circuit device, the first package paddle, the second package paddle, and the standoff terminal, the encapsulation exposing a portion of the first package paddle, the second package paddle, and the standoff terminal in a block 710.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a leadframe having a top side, a gap, a first non-horizontal side, and a second non-horizontal side, the first non-horizontal side facing the second non-horizontal side and separated from the second non-horizontal side by the gap;
   attaching an integrated circuit device on the top side with a non-conductive adhesive, wherein the non-conductive adhesive is in the gap and directly on the first non-horizontal side and the second non-horizontal side;
   connecting a plurality of paddle connectors between the integrated circuit device and the top side;
   connecting a terminal connector between the integrated circuit device and the top side;
   forming an encapsulation over the integrated circuit device, the plurality of the paddle connectors, the terminal connector, and the top side; and
   forming the bottom side of the leadframe to form a first package paddle and a second package paddle under corners of the integrated circuit device with the plurality of the paddle connectors connected to the first package paddle and to form a standoff terminal smaller than the first package paddle with the terminal connector connected thereto.

2. The method as claimed in claim 1 wherein forming the bottom side of the leadframe includes forming the first package paddle and the second package paddle, wherein the first package paddle includes a first lower paddle end, the second package paddle includes a second lower paddle end, and the first lower paddle end and the second lower paddle end are exposed from the encapsulation.

3. The method as claimed in claim 1 further comprising connecting the first package paddle to a voltage level and the second package paddle to another voltage level different from the voltage level of the first package paddle.

4. The method as claimed in claim 1 wherein forming the bottom side of the leadframe includes forming the first package paddle having a size different from a size of the second package paddle.

5. The method as claimed in claim 1 further comprising connecting a third package paddle electrically to the integrated circuit device.

6. A method of manufacture of an integrated circuit packaging system comprising:
   providing a leadframe having a top side, a gap, a first non-horizontal side, and a second non-horizontal side, the first non-horizontal side facing the second non-horizontal side and separated from the second non-horizontal side by the gap;
   attaching an integrated circuit device on the top side with a non-conductive adhesive, wherein the non-conductive adhesive is in the gap and directly on the first non-horizontal side and the second non-horizontal side;
   connecting a plurality of paddle connectors between the integrated circuit device and the top side;
   connecting a plurality of terminal connectors between the integrated circuit device and the top side;
   forming an encapsulation over the integrated circuit device, the plurality of the paddle connectors, the plurality of the terminal connectors, and the top side; and
   forming the bottom side of the leadframe to form a first package paddle and a second package paddle under corners of the integrated circuit device with the plurality of the paddle connectors connected to the first package paddle and to form a plurality of standoff terminals around and smaller than the first package paddle with one of the plurality of the terminal connectors connected to one of the plurality of the standoff terminals.

7. The method as claimed in claim 6 wherein forming the bottom side of the leadframe includes forming the bottom side of the leadframe to form the first package paddle and the second package paddle, wherein the first package paddle includes a first lower paddle end, the second package paddle includes a second lower paddle end, and the first lower paddle end and the second lower paddle end are exposed and protruding from the encapsulation.

8. The method as claimed in claim 6 further comprising connecting the first package paddle to a ground and the second package paddle to another ground different from the ground of the first package paddle.

9. The method as claimed in claim 6 wherein forming the bottom side of the leadframe includes forming the first package paddle having a shape different from a shape of the second package paddle.

10. The method as claimed in claim 6 further comprising:
    connecting a third package paddle electrically to the integrated circuit device; and wherein:
    forming the bottom side of the leadframe includes forming the plurality of the standoff terminals, each of the plurality of the standoff terminals having an inner standoff width greater than an outer standoff width and smaller than the third package paddle.

* * * * *